United States Patent [19]

Nasu et al.

[11] Patent Number: 5,475,552
[45] Date of Patent: Dec. 12, 1995

[54] MAGNETIC HEAD HAVING A CHROMIUM NITRIDE PROTECTIVE FILM FOR USE IN A MAGNETIC RECORDING AND/OR REPRODUCING APPARATUS AND A METHOD OF MANUFACTURING THE SAME

[75] Inventors: Shogo Nasu, Katano; Hiroshi Ryonai, Osaka, both of Japan

[73] Assignee: Matsushita Electric Industrial Co., Ltd., Osaka, Japan

[21] Appl. No.: 98,836

[22] Filed: Jul. 29, 1993

[30] Foreign Application Priority Data

Jul. 31, 1992 [JP] Japan ................................ 4-204816
Nov. 6, 1992 [JP] Japan ................................ 4-296851

[51] Int. Cl.$^6$ .......................................... G11B 5/187
[52] U.S. Cl. ................................................ 360/122
[58] Field of Search .......................... 360/122, 121, 360/125, 126

[56] References Cited

U.S. PATENT DOCUMENTS

| | | | |
|---|---|---|---|
| 4,761,334 | 8/1988 | Sagoi et al. | 428/332 |
| 4,983,465 | 1/1991 | Shimizu et al. | 360/126 |
| 5,287,239 | 2/1994 | Iwasaki | 360/126 |

FOREIGN PATENT DOCUMENTS

| | | |
|---|---|---|
| 0123826 | 11/1984 | European Pat. Off. . |
| 0528459 | 2/1993 | European Pat. Off. . |
| 55-12652 | 4/1980 | Japan . |
| 56-1682 | 1/1981 | Japan . |
| 61-211807 | 9/1986 | Japan . |
| 62-31010 | 2/1987 | Japan . |
| 63-58613 | 3/1988 | Japan ................................ 360/122 |
| 3-267363 | 11/1991 | Japan . |
| 85/02289 | 5/1985 | WIPO . |

OTHER PUBLICATIONS

Patent Abstracts of Japan, vol. 15, No. 167 (C–0827) Apr. 26, 1991.
Patent Abstracts of Japan, vol. 14, No. 074 (C–0687) Feb. 13, 1990.
Patent Abstracts of Japan, vol. 11, No. 163 (C–424) May 26, 1987.
Database WPI, Section Ch, Week 8627, Derwent Publications Ltd., London, GB; Class M13, AN 86-173489.
Patent Abstracts of Japan, vol. 13, No. 420 (M–872) Sep. 19, 1989.
Database WPI, Section Ch, Week 8230, Derwent Publications Ltd., London, GB; Class M13, AN 82-61665E.
Database WPI, Section CH, Week 9226, Derwent Publications Ltd., London, GB; Class M13, AN 92-212965.
Database WPI, Section Ch, Week 9314, Derwent Publications Ltd., London, GB; Class A12, AN 93-113709.
Morrison et al., "Magnetic Transducer Head", IBM Technical. Disclosure Bulletin, vol. 7, No. 4, Sep. 1964.
Patent Abstracts of Japan, vol. 13, No. 302 (C–616) Jul. 12, 1989.

Primary Examiner—John H. Wolff
Assistant Examiner—Allen Cao
Attorney, Agent, or Firm—Wenderoth, Lind & Ponack

[57] ABSTRACT

A magnetic head is provided with a protective film of chromium nitride on its sliding surface. The film thickness is set to have no adverse effect upon the electromagnetic conversion characteristics of the head, and the film has sufficient wear resistance not only against a magnetic tape having its sliding surface formed of iron oxide or other metallic magnetic substances, but also against a magnetic tape having its sliding surface formed of chrome oxide, the chrome oxide substance having a strong abrasion effect upon the magnetic head. The protective film has a compressive internal stress in a range of $10^9$ to $10^{11}$ dynes/cm$^2$, a Knoop hardness of not less than 1500 kgf/mm$^2$, a nitrogen composition ratio in a range of 20 to 60 atom %, and a film thickness in a range of 50 to 1000Å.

5 Claims, 4 Drawing Sheets

Side View

Top View

Side View

MAGNETIC HEAD HAVING A CHROMIUM NITRIDE PROTECTIVE FILM FOR USE IN A MAGNETIC RECORDING AND/OR REPRODUCING APPARATUS AND A METHOD OF MANUFACTURING THE SAME

BACKGROUND OF THE INVENTION

1. Field of the Invention

The present invention relates to a magnetic head for use in a tape recorder such as an audio tape recorder, video tape recorder and digital audio tape recorder, and other magnetic recording and reproducing apparatus for a hard disk, floppy disk, magnetic card and the like, and more particularly relates to a magnetic head having a chromium nitride protective film and to a method of manufacturing the same.

2. Description of the Prior Art

In a general magnetic recording and reproducing apparatus, a magnetic head is used for recording, reproducing, and erasing data by sliding a magnetic recording medium such as a magnetic tape or magnetic disk on a top surface of the magnetic head. In such a case, a magnetic head is involved with a problem that the sliding movement of the head in contact with a recording medium inevitably causes frictional wear of the top surface of the head, which eventually leads to the deterioration of electromagnetic conversion characteristics of the magnetic head performance.

In attempts to eliminate such a problem, there have been made various proposals. For example, in the Japanese Patent Publication No. 56-1682 (published in 1981), there is disclosed a method where a boron imparting material is applied to the sliding surface of the magnetic head, which is then subjected to an annealing process to form a boron diffused layer thereon to substantially harden the sliding surface of the head with an improvement in wear resistance.

Another method has been proposed in the Japanese Patent Publication No. 55-12652 (published in 1980) where metal hardening atoms are implanted by ion implantation into the sliding surface of the magnetic head to harden the sliding surface, whereby improvement in wear resistance is achieved.

Further, there has been proposed still another method where improvement in wear resistance of the magnetic head is achieved by coating a thin film having a high degree of hardness on the sliding surface of the magnetic head. For example, in the Japanese Patent Unexamined Laid-Open 267363/1991, disclosed is a method in which a thin film of boron nitride is provided on a surface of an intermediate thin layer which is formed on the sliding surface of the magnetic head. The intermediate thin layer contains at least one kind of element of group IIIb, group IVa and group IVb elements.

However, these methods involve the following problems. That is, in the method which comprises a process of thermal diffusion of a boron material, as well as in the method which comprises a process of ion implantation, the control operation of the process must be strictly effected for adjusting the temperature, cooling velocity, and the like, which results in higher production cost. Further, the use of a high temperature treatment and the impact of ions may adversely affect the interior of the magnetic head.

With the method which comprises a process of forming a thin film of boron nitride, there is a problem involved in that a two-layer structure is required. That is, the boron nitride film is formed on an intermediate thin layer, which naturally results in lower productivity. Another problem is that, for the purpose of an improvement in wear resistance, the thin film coating is often made thicker than 0.1 μm in its total thickness, so that the thin film of the head defines a spacing between the head and a recording medium. Hence, the spacing virtually causes a loss due to uneven wear of the sliding surface, deteriorating the electromagnetic conversion characteristics of the head. Even a degree of film thickness of more than 0.1 μm is not sufficient to achieve a good wear resistance.

Accordingly, the present inventor attempted to form a protective film made of chromium nitride on a sliding surface of a magnetic head by a method using a reactive high-frequency magnetron sputtering technique. Then the inventor discovered the fact that this approach could provide a film coating having no adverse influence on the electromagnetic conversion characteristics of the head with its thickness less than 0.1 μm, which still has excellent wear resistance. In the tests of driving the magnetic head with a magnetic tape having its magnetic layer composed of an iron oxide magnetic substance, the protective film coated on the sliding surface of the magnetic head exhibited an excellent wear resistance, having an endurance in driving for more than 1000 hours.

However, in the driving tests using a magnetic tape having its magnetic layer containing a chrome oxide magnetic substance, since the chrome oxide has a high abrasive force against the magnetic head, there occurred many spot-like peelings of the protective film of chromium nitride on the sliding surface of the head in driving for 100 hours, and the area of the peeling portion was increased with time lapse of the driving to an extent that the protective film of chromium nitride was peeled off over an area of about one half of the sliding surface area of the head in a time period of 500 hours.

Further, there has not been known yet in the art any protective coating film for magnetic heads which can exhibit excellent wear resistance as well stand a driving test for more than 1000 hours against a magnetic tape having its magnetic layer composed of a chrome oxide magnetic substance.

SUMMARY OF THE INVENTION

Therefore, it is an essential objective of the present invention to provide a magnetic head having a protective thin film formed on a sliding surface where the thickness of the protective thin film is made thin in a range exerting no adverse effect on the electromagnetic conversion characteristics of the magnetic head, and improving the magnetic head in wear resistance against a magnetic tape having its magnetic layer composed of a chrome oxide magnetic substance which has a strong abrasion effect upon the magnetic head.

Another objective of the present invention is to provide a method of manufacturing the same magnetic head as mentioned above.

According to one aspect of the invention, there is provided a magnetic head comprising a protective thin film of a chromium nitride substance formed on a sliding surface of the magnetic head which is slidable along with a surface of a magnetic recording medium. The chromium nitride thin film formed on the sliding surface of the magnetic head has a compressive internal stress in a range of $10^9$ to $10^{11}$ dynes/cm$^2$, a Knoop hardness of not less than 1500 kgf/mm$^2$, a nitrogen composition ratio of 20 to 60 atom %, with its thickness in a range of 50 to 1000Å.

The magnetic head in accordance with the present invention has a protective thin film of chromium nitride substance formed on the sliding surface of the head, the chromium nitride protective film meeting the following conditions: the protective film has a compressive internal stress of $10^9$ to $10^{11}$ dynes/cm$^2$; and its Knoop hardness is not less than 1500 kgf/mm$^2$, with its nitrogen composition ratio 20 to 60 atom %, whereby the magnetic head can exhibit excellent wear resistance not only against a magnetic tape having its magnetic layer composed of an iron oxide magnetic substance and other metallic magnetic materials, but also against a magnetic tape having its magnetic layer composed of a chrome oxide magnetic substance which has a strong abrasion effect upon the head.

The thickness of the protective film is made thin within the range of 50 to 1000Å, in which range there is caused no spacing loss on the relation between the magnetic head and the magnetic recording medium. Therefore, it is possible to provide a magnetic head highly resistant to frictional wear by providing a protective film with its thickness made thin in a range exerting no spacing effect between the magnetic head and the magnetic recording medium.

Furthermore, in the process of forming the protective chromium nitride film, the temperature of the substrate of the magnetic head for film formation is kept at room temperature, thereby preventing thermal deterioration of the magnetic head.

BRIEF DESCRIPTION OF THE DRAWINGS

These and other objects and features of the present invention will become apparent from the following description, taken in conjunction with the preferred embodiment thereof and with reference to the accompanying drawings, in which.

DETAILED DESCRIPTION OF THE PREFERRED EMBODIMENTS

One embodiment of the present invention will now be described in detail with reference to the attached drawings.

For fabrication of a chromium nitride protective film, there is employed a method according to a physical vapor deposition technique. In this embodiment, a reactive high-frequency magnetron sputtering technique was employed for providing a chromium nitride film for protection.

Figure 1:
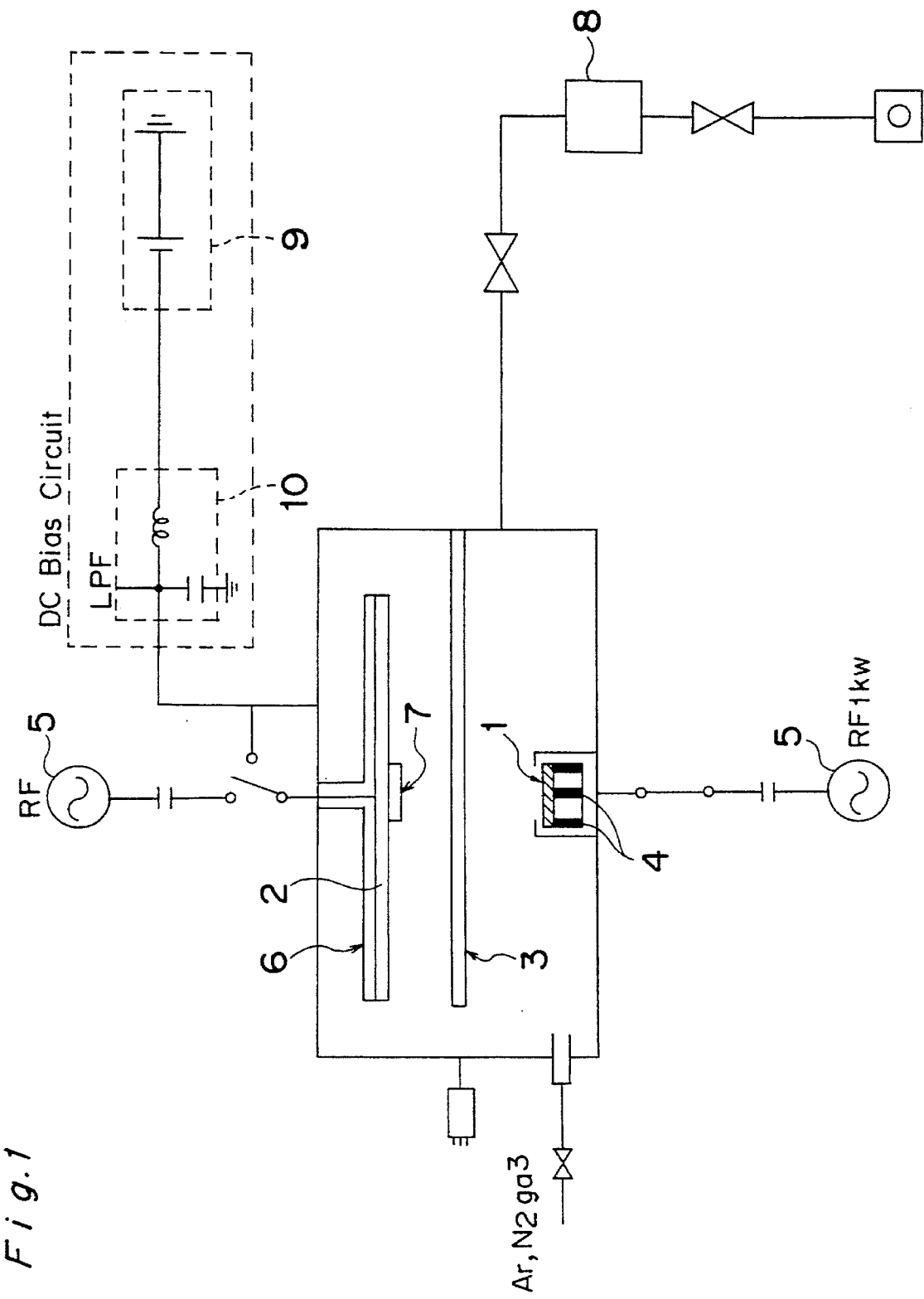
FIG. 1 is a schematic view of a reactive high-frequency magnetron sputtering technique employed in the embodiment of the present invention.

FIG. 1 shows a schematic view of a reactive high-frequency magnetron sputtering technique, where a protective thin film of chromium nitride was formed by effecting a high-frequency electric discharge in a mixture gas of argon and nitrogen using a chrome target 1 of 6 inches in diameter. The chrome target 1, disposed on a magneto mechanism 4, is sputtered by high-frequency electric discharge from a RF power source 5 in the mixture gas of argon and nitrogen to be coated onto a substrate 2 through a shutter 3. The substrate 2, having a head chip attachment member 7, is held by a holder 6.

The chromium nitride film was formed under the conditions that: the substrate for forming the film thereon was water-cooled (water-cooling means is not shown); electric power of 400 W was used for sputtering; and mixture gas pressure for the sputtering was kept constant at 8 milli Torr by means of a cryopump 8. The temperature of the substrate 2 for the head was kept at room temperature in a range of not more than 40° C. while the holder 6 for holding the substrate was also water-cooled. In this process, the temperature of the substrate was measured by means of a sheet shaped temperature sensor such as "Heat-Label" made by Micron Co., Ltd. (not shown).

A negative DC bias voltage supplied from a DC power source 9 in a DC bias circuit was applied to the substrate 2 through a low-pass filter 10 during the film forming process for improving the crystallinity and adhesion of the chromium nitride film. The nitrogen composition ratio of the protective chromium nitride film was controlled by varying the argon to nitrogen ratio of the sputtering gas mixture. The nitrogen content of the film was analyzed according to the Auger electron spectroscopic method.

In this preferred embodiment, the internal stress of the chromium nitride film was controlled by controlling the nitrogen composition ratio, DC bias voltage and total sputtering gas pressure. The internal stress was measured on the basis of the warp amount of a disk-shaped silicon substrate on which the chromium nitride film was deposited using a known stress measurement device. Knoop hardness measurement was carried out by using a microhardness tester commercialized as MVK-1 (made by Akashi Seisakusho Co., Ltd.). The thickness of the chromium nitride film is controlled by controlling the deposition time of the film, where the deposition speed of the chromium nitride film was kept constant at approximately 6.3Å per second.

Figure 2A:
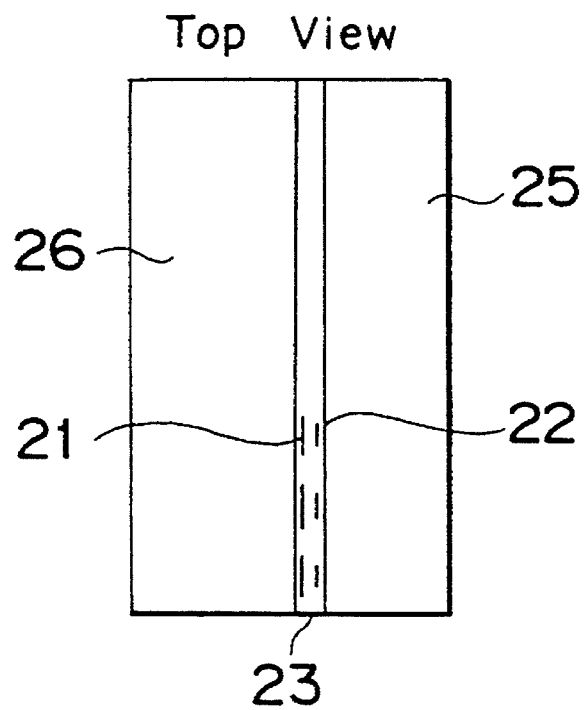
FIGS. 2(a) and 2(b) are top and side plan views of a magnetic head according to the present invention.
Figure 2B:
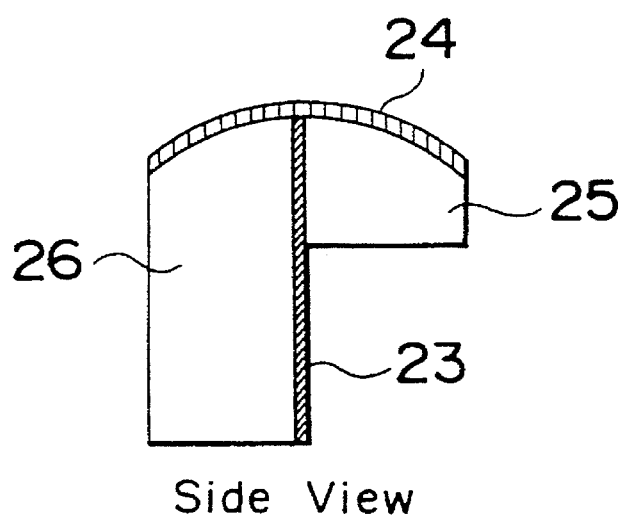

FIGS. 2(a) and 2(b) show an example of a structure of a magnetic head, where a substrate 26 is conjoined with a cover member 25 by way of a core body 23 interposed between the substrate 26 and the cover member 25. In this embodiment, an AlTiC material was used for both the substrate 26 and the cover member 25. The core body 23 is made of a magnetic thin film, which is formed with recording and reproducing tracks 21 and 22. A protective thin film 24 is formed on the sliding surface of the magnetic head, covering the top portions of the substrate 26, cover member 25 and core body 23.

It is to be noted here that the structure of the magnetic head is not limited to this, and modifications thereof can be made using the improvement of the protective thin film of chromium nitride.

The core body 23 may be made of a NiZn ferrite material other than the AlTiC material. Also, the cover member may be made of a barium titanate material other than the AlTiC material.

In view of the observation made by the inventor that, when a magnetic tape has its magnetic layer composed of a chrome oxide material, the abrasive force of the magnetic tape to the magnetic head is largely attributable to the hardness of chrome oxide particles per se, the present inventor closely examined the hardness of a chromium nitride film serving as a protective thin film of the magnetic head. As a result of the examination, it was found that there is an intimate relationship between the hardness of the chromium nitride film and the compressive internal stress of the chromium nitride film where the chromium nitride film is formed on the substrate held at a room temperature. The compressive internal stress of the chromium nitride film can be controlled by varying the total sputtering gas pressure, the negative DC bias voltage applied to the substrate and the like.

Figure 3:
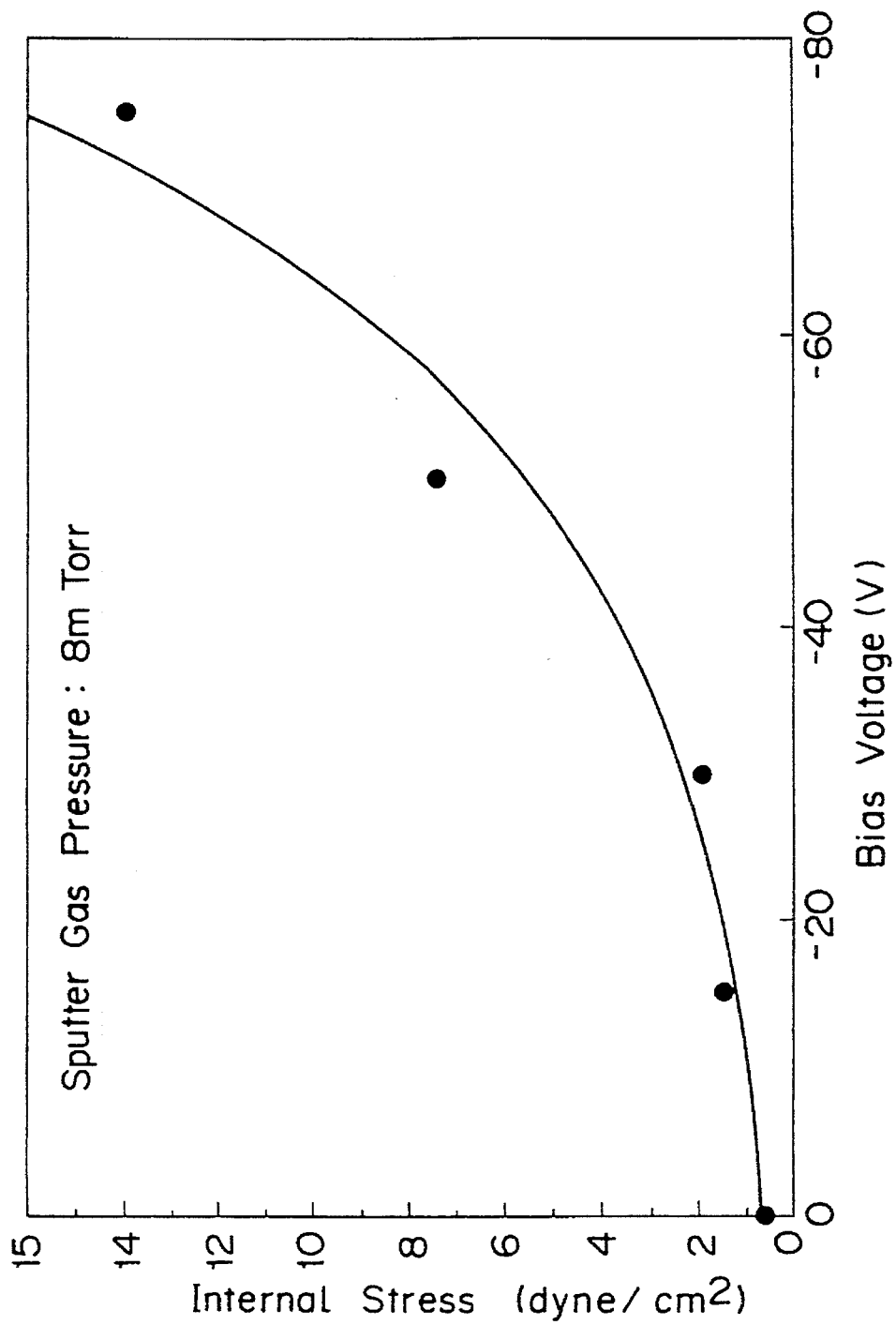
FIG. 3 is a graph showing a relationship between a negative DC bias voltage and compressive internal stress of a chromium nitride film according to the present invention.

FIG. 3 shows a relationship between the negative DC bias voltage applied to the substrate and the compressive internal stress of the chromium nitride film under the condition that the total sputtering gas pressure is kept constant at 8 milli Torr with the nitrogen/argon gas ratio of 1:1. It can be understood from the figure that the greater the negative DC bias voltage, the greater the internal stress.

Figure 4:
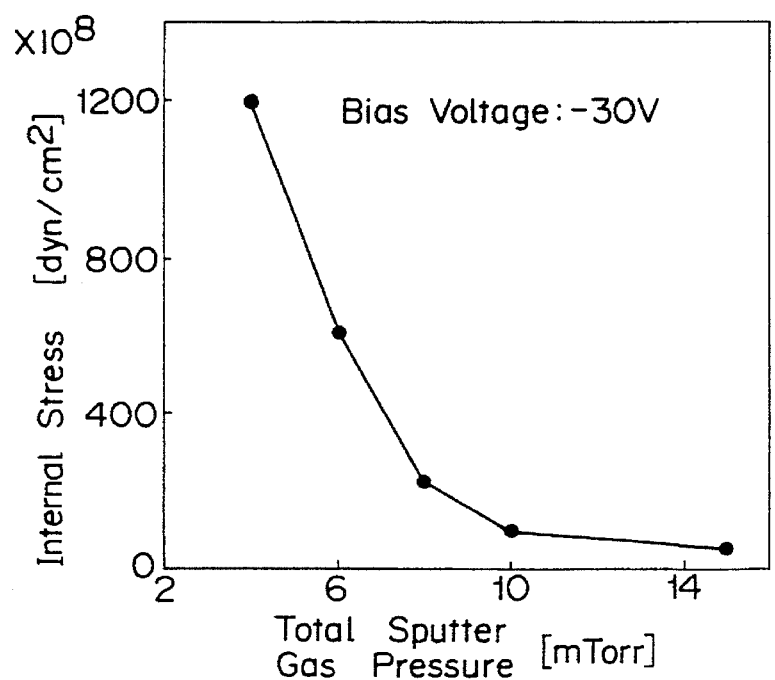
FIG. 4 is a graph showing a relationship between internal stress of the chromium nitride film and total gas sputtering pressure in the process of fabricating the film in the embodiment of the present invention.

FIG. 4 shows a relationship between the total sputtering gas pressure and the compressive internal stress of the chromium nitride film under the condition that the nitrogen/argon gas ratio is 1:1 and the DC bias voltage is −30 V. It can be understood from the figure that the lower the sputtering gas pressure, the greater the internal stress. Even where the negative DC bias voltage was increased, the internal stress grew larger. Therefore, the control of the internal stress was effected by varying the sputtering gas pressure and/or the negative DC bias voltage.

Figure 5:
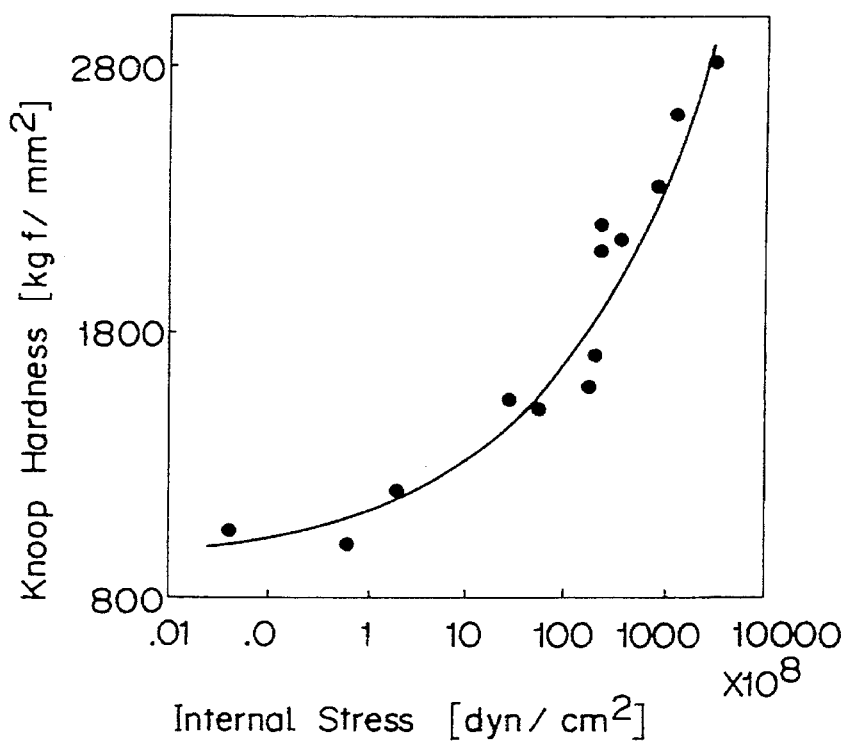
FIG. 5 is a graph showing a relationship between compressive internal stress and Knoop hardness with respect to a chromium nitride film in the embodiment of the invention.

FIG. 5 shows a relationship between compressive internal stress values and Knoop hardness values of a chromium nitride film, where the internal stress is varied through control of the negative DC bias voltage as shown in FIG. 3. In this example, the nitrogen composition ratio of the chromium nitride film was set in a range of 40 to 50 atom %. It can be seen from FIG. 5 that there is a correlation between the internal stress and the Knoop hardness such that the Knoop hardness value becomes greater as the compressive internal stress value increases. When the internal stress is not less than $10^9$ dynes/cm$^2$, the Knoop hardness is not less than 1500 kgf/mm$^2$ but not more than 2800 kgf/mm$^2$. When the internal stress is greater than $10^{11}$ dynes/cm$^2$, there occur cracking and film peeling over the entire surface of the chromium nitride film, rendering the chromium nitride film useless for purposes of protecting the magnetic head.

In order to evaluate the wear resistance of the chromium nitride film mentioned above, magnetic heads coated with chromium nitride films were subjected to abrasion resistance testing. In this embodiment, the thickness of the chromium nitride film was kept constant at 500Å in all of the test samples. Each magnetic head was incorporated into a cassette deck mechanism, and the wear resistance evaluation test was effected under a pad pressure of 20 g, using a magnetic tape having its magnetic layer formed of a chrome oxide substance. Each magnetic head used in the test for the wear resistance evaluation was of an AlTiC/AlTiC type using AlTiC for both the substrate and the cover members. Tape drive tests were carried out under ordinary temperature and ordinary humidity conditions for 1000 hours in such a manner that each magnetic tape was replaced with a new magnetic tape at 100 hour intervals.

Table 1 shows the results of the tests for the wear resistance evaluation in the embodiment according to the present invention.

In Table 1, exemplified Examples 1 through 3 represent the cases in which the negative DC bias voltage was varied to increase the internal stress of the chromium nitride film at a constant sputter gas pressure of 8.0 m Torr. In the exemplified Examples 1 through 3, the Knoop hardness values were 1510 kgf/mm$^2$, 2100 kgf/mm$^2$ and 2330 kgf/mm$^2$ under application of the negative DC bias voltages of 0 V, −30 V and −50 V, respectively.

Exemplified Examples 4 through 6 represent the cases in which the internal stress was varied by setting the DC bias voltage −50 V, −75 V and 0 V at a constant sputter gas pressure of 4.0 m Torr. The Knoop hardness values were 2610 kgf/mm$^2$, 2800 kgf/mm$^2$, and 1750 kgf/mm$^2$ with the internal stress values of $12.6 \times 10^{10}$ dynes/cm$^2$, $32.5 \times 10^{10}$ dynes/cm$^2$ and $4.0 \times 10^{10}$ dynes/cm$^2$ respectively. Referring to Examples 3 and 4, the total sputter gas pressure was varied from 8.0 to 4.0 m Torr to increase the internal stress at a constant DC bias voltage of −50 V. In any of Examples 1 through 6, the Knoop hardness value was as high as more than 1500 kgf/mm$^2$, and excellent wear resistance was obtained such that there occurred little or almost no peel-off wear of chromium nitride film from the substrate even after 1000 hour sliding operation of the magnetic head in contact with the magnetic tape having its magnetic layer formed of highly abrasive chrome oxide film.

In contrast, as shown in Reference Examples 1 to 3 for comparison, in the case where the internal stress of the chromium nitride film was smaller than $1 \times 10^9$ dynes/cm$^2$ and the Knoop hardness was less than 1500 kgf/mm$^2$, scratch marks were produced in large numbers on the surface of the film after sliding the magnetic head in contact with the magnetic tape for 1000 hours, and the head thus suffered considerable peel-off wear.

Also, as can be seen in the case of Reference Examples 4 and 5 for comparison, when larger DC bias voltages of −100 V and smaller sputter gas pressures of 8.0 and 4.0 m Torr were used to thereby increase the internal stress above $10^{11}$ dynes/cm$^2$, the Knoop hardness was inversely lowered and cracks occurred immediately after the process of coating the film. This indicates that the internal stress becomes excessively large so that releasing of stress is started. Such chromium nitride films are not suitable for use as protective films of a magnetic head. It may be appreciated from the above discussion that a chromium nitride film having a compressive internal stress in a range from $1\times10^9$ to $1\times10^{11}$ dynes/cm$^2$ with a Knoop hardness of not less than 1500 kgf/mm$^2$ can provide excellent wear resistance of a protective film for the magnetic head.

Table 2 shows the results of wear resistance tests of chromium nitride films according to the embodiment of the invention, where the nitrogen composition ratio of the chromium nitride film was varied to control the internal stress of the chromium nitride film.

Exemplified Examples 7 to 10 are the cases where the nitrogen composition of the chromium nitride film was varied within the range from 20 to 60 atom %, with a DC bias voltage kept constant at −30 V. No or little, if any, peel-off wear was found in any of these Examples 7 through 10 after 1000 hours of sliding movement of the magnetic head over a magnetic tape.

Reference Examples 6 and 7, for comparison, are the cases where the DC bias voltage applied to the substrate was almost same as that in the exemplified Examples 7 to 9, but the nitrogen composition was less than 20 atom %. Also, Reference Examples 8 and 9, for comparison, are the cases where the DC bias voltage was almost the same as that in exemplified Examples 7 to 9, but the nitrogen composition was greater than 60 atom %. In any of the reference Examples 6 to 9, for comparison, peel-off wear was found noticeable.

This is because when the nitrogen composition is less than 20 atom %, metal chrome characteristics are pronounced. Presumably, therefore, even if the compressive internal stress is high, the Knoop hardness is reduced, resulting in decreased wear resistance. On the other hand, when the nitrogen composition is greater than 60 atom %, there is a considerable change in the structure of the chromium nitride film and presumably, therefore, both the internal stress and the Knoop hardness are substantially reduced, which results in decreased wear resistance.

On the basis of these observations, in order to achieve good frictional wear resistance, the nitrogen composition of a chromium nitride film should preferably be within the range of 20 to 60 atom %.

Table 3 shows the results of tests in which the chromium nitride film according to the embodiment of the invention was varied in thickness. In Table 3, exemplified Example 11 is a case in which the thickness of the chromium nitride film is very thin, on the order of 50Å. Despite the fact that the film was very thin, it exhibited good wear resistance, such that peel-off wear was limited to 10% or less after 1000 hour sliding of the magnetic head along with the magnetic tape.

In contrast, in Reference Example 10, for comparison, in which the thickness of the film was as thin as 30Å, a greater degree of peel-off wear was observed, more than 30%. Presumably, this may be attributable to the fact that the chromium nitride was still in its initial growing stage, and the degree of its crystallinity was insufficient. As shown in exemplified Example 12 and Reference Example 11, for comparison, where the film thickness was 1000Å or more, the film exhibited excellent wear resistance. However, the film of such a high order of thickness will constitute a spacing per se, thus deteriorating the electro-magnetic conversion characteristics to decrease the recording and reproducing performance of the magnetic head. Therefore, the thickness of the film must be not more than 1000Å. Hence, in order to achieve high wear resistance and high reproduction output performance, the thickness of a chromium nitride film should preferably be within the range of 50 to 1000Å.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

TABLE 1

|  | Bias voltage (V) | Sputter gas pressure m Torr | Internal stress ×10$^{10}$ dyn/cm$^2$ | Knoop hardness kgf/mm$^2$ | Surface condition after 1000 hr. sliding |
|---|---|---|---|---|---|
| Example 1 | 0 | 8.0 | 0.6 | 1510 | Peel-off wear, 10% or less |
| Example 2 | −30 | 8.0 | 2.0 | 2100 | Peel-off wear, none |
| Example 3 | −50 | 8.0 | 7.5 | 2330 | Peel-off wear, none |
| Example 4 | −50 | 4.0 | 12.6 | 2610 | Peel-off wear, 1% or less |
| Example 5 | −75 | 4.0 | 32.5 | 2800 | Peel-off wear, none |
| Example 6 | 0 | 4.0 | 4.0 | 1750 | Peel-off wear, 5% or less |
| Ref. Ex. 1 | 0 | 15.0 | 0.08 | 1400 | Peel-off wear, 60% or more |
| Ref. Ex. 2 | 0 | 20.0 | 0.007 | 1010 | Peel-off wear, 100% |
| Ref. Ex. 3 | −30 | 20.0 | 0.07 | 1200 | Peel-off wear, 80% |
| Ref. Ex. 4 | −100 | 8.0 | 105.0 | 1600 | Cracks & peel-off |
| Ref. Ex. 5 | −100 | 4.0 | — | — | Cracks & peel-off |

TABLE 2

|  | Bias voltage (V) | Nitrogen content atom % | Internal stress ×10$^{10}$ dyn/cm$^2$ | Knoop hardness kgf/mm$^2$ | Surface condition after 1000 hr. sliding |
| --- | --- | --- | --- | --- | --- |
| Example 7 | −30 | 20 | 1.8 | 2000 | Peel-off wear, 1% or less |
| Example 8 | −30 | 40 | 2.0 | 2150 | Peel-off wear, none |
| Example 9 | −30 | 50 | 7.5 | 2300 | Peel-off wear, none |
| Example 10 | −30 | 60 | 1.2 | 1730 | Peel-off wear, 10% or less |
| Ref. Ex. 6 | −30 | 10 | 1.1 | 900 | Peel-off wear, 60% or more |
| Ref. Ex. 7 | −30 | 15 | 1.2 | 1010 | Peel-off wear, 100% |
| Ref. Ex. 8 | −30 | 65 | 0.07 | 1200 | Peel-off wear, 80% |
| Ref. Ex. 9 | −30 | 70 | 0.02 | 860 | Peel-off wear, 100% |

TABLE 3

|  | Film thickness (Å) | Bias voltage (V) | Internal stress ×10$^{10}$ dyn/cm$^2$ | Knoop hardness kgf/mm$^2$ | Surface condition after 1000 hr. sliding |
| --- | --- | --- | --- | --- | --- |
| Example 11 | 50 | −30 | 1.6 | 2100 | Peel-off wear, 10% or less |
| Example 12 | 1000 | −30 | 2.5 | 2360 | Peel-off wear, none |
| Ref. Ex. 10 | 30 | −30 | 1.5 | 2000 | Peel-off wear, 30% or more |
| Ref. Ex. 11 | 1500 | −30 | 1.7 | 2250 | Peel-off wear, none |

What is claimed is:

1. A magnetic head, comprising:

a substrate having a top surface;

a cover member covering said substrate and having a top surface;

a core body interposed between said substrate and said cover member and having a top surface; and a protective thin film comprising a chromium nitride substance formed on and covering said top surfaces of said substrate, said cover member and said core body, said protective thin film having a compressive internal stress in a range of 10$^9$ to 10$^{11}$ dynes/cm$^2$, a Knoop hardness in a range of 1500 kgf/mm$^2$ to 2800 kgf/mm$^2$, a nitrogen composition ratio in a range of 20 to 60 atom % and a film thickness in a range of 50 to 1000Å.

2. The magnetic head as set forth in claim 1, where said substrate and said cover member comprise an AlTiC material.

3. The magnetic head as set forth in claim 1, wherein said core body comprises a magnetic thin film having recording and reproducing tracks.

4. The magnetic head as set forth in claim 1, wherein said core body and said cover member both comprise an AlTiC material.

5. The magnetic head as set forth in claim 1, wherein said core body comprises a NiZn ferrite material and said cover member comprises a Barium Titanate material.

* * * * *